(12) United States Patent
Faure et al.

(10) Patent No.: US 8,153,500 B2
(45) Date of Patent: Apr. 10, 2012

(54) METHOD OF FABRICATING AN EPITAXIALLY GROWN LAYER ON A COMPOSITE STRUCTURE

(75) Inventors: Bruce Faure, Grenoble (FR);
Alexandra Marcovecchio, Grenoble (FR)

(73) Assignee: Soitec, Bernin (FR)

( * ) Notice: Subject to any disclaimer, the term of this patent is extended or adjusted under 35 U.S.C. 154(b) by 323 days.

(21) Appl. No.: 12/663,696

(22) PCT Filed: Jan. 6, 2009

(86) PCT No.: PCT/EP2009/050086
§ 371 (c)(1),
(2), (4) Date: Dec. 8, 2009

(87) PCT Pub. No.: WO2009/092624
PCT Pub. Date: Jul. 30, 2009

(65) Prior Publication Data
US 2010/0178749 A1    Jul. 15, 2010

(30) Foreign Application Priority Data
Jan. 21, 2008    (FR) ..................... 08 50362

(51) Int. Cl.
*H01L 21/76* (2006.01)

(52) U.S. Cl. .. 438/406; 438/458; 438/464; 438/E21.211
(58) Field of Classification Search .......... None
See application file for complete search history.

(56) References Cited

U.S. PATENT DOCUMENTS

| | | | | |
|---|---|---|---|---|
| 6,326,279 B1 * | 12/2001 | Kakizaki et al. | ............. | 438/406 |
| 6,774,435 B1 * | 8/2004 | Matsumoto et al. | ............. | 257/347 |
| 6,867,067 B2 * | 3/2005 | Ghyselen et al. | ............. | 438/107 |
| 7,071,029 B2 * | 7/2006 | Ghyselen et al. | ............. | 438/107 |
| 7,465,991 B2 * | 12/2008 | Ghyselen et al. | ............. | 257/347 |
| 7,741,678 B2 * | 6/2010 | Ghyselen et al. | ............. | 257/347 |
| 2002/0022337 A1 | 2/2002 | Maleville et al. | ............. | 438/406 |
| 2006/0076559 A1 | 4/2006 | Faure et al. | ............. | 257/49 |
| 2006/0234486 A1 | 10/2006 | Speck et al. | ............. | 438/590 |
| 2008/0038564 A1 | 2/2008 | Bruel | ............. | 428/446 |

FOREIGN PATENT DOCUMENTS

| | | |
|---|---|---|
| EP | 0 898 307 | 2/1999 |
| FR | 2 857 983 | 1/2005 |
| FR | 2 860 249 | 4/2005 |
| WO | WO 02/084722 | 10/2002 |
| WO | WO 2005/034218 | 4/2005 |
| WO | WO 2005/074022 | 8/2005 |

OTHER PUBLICATIONS

International Search Report, PCT/EP2009/050086, mailed Mar. 6, 2009.

* cited by examiner

*Primary Examiner* — Alonzo Chambliss
(74) *Attorney, Agent, or Firm* — Winston & Strawn LLP

(57) ABSTRACT

A method of fabricating materials by epitaxy by epitaxially growing at least one layer of a material upon a composite structure that has at least one thin film bonded to a support substrate and a bonding layer of oxide formed by deposition between the support substrate and the thin film. The thin film and the support substrate have a mean thermal expansion coefficient of $7\times10^{-6}$ $K^{-1}$ or more. The bonding layer is formed by low pressure chemical vapor deposition (LPCVD) of a layer of silicon oxide on the bonding face of the support substrate or on the bonding face of the thin film. The thin film has a thickness of 5 micrometers or less while the thickness of the layer of oxide is equal to or greater than the thickness of the thin film. The method also includes a heat treatment carried out at a temperature that is higher than the temperature for deposition of the layer of oxide of silicon and for a predetermined period.

15 Claims, 7 Drawing Sheets

METHOD OF FABRICATING AN EPITAXIALLY GROWN LAYER ON A COMPOSITE STRUCTURE

This application is a 371 filing of International Patent Application PCT/EP2009/050086 filed Jan. 6, 2006.

TECHNICAL FIELD AND PRIOR ART

The present invention relates to the fabrication of layers grown epitaxially on a composite structure and to the detachment of such a layer from the structure. More precisely, the invention relates to the detachment of the support from the remainder of the composite structure after epitaxy, thereby enabling the support to be recycled, and the epitaxially grown layer to be released or to be transferred onto a final support if it is not self-supporting.

Group III/N materials are endowed with particular electronic properties, such as a wide band-gap, which renders them highly advantageous for use in optics, optoelectronics, and electronics. However, such materials are not available in bulk form, in quantities, in diameters, or at prices that mean that they can be used on a large industrial scale. They are fabricated by heteroepitaxy on substrates or structures that are adapted to produce crystalline growth with a minimal defect density. Possible structures for heteroepitaxial growth are composites provided with a thin seed film that has a lattice parameter that is adapted to the parameter of the material to be grown epitaxially in order to minimize the formation of crystal defects. The support substrate for such structures is selected so that its thermal expansion coefficient is close to that of the material to be grown epitaxially, thereby avoiding cracking of the epitaxially grown material during cooling thereof. Such growth structures do not have the properties required for optimal use in devices for use in optoelectronics, optics, or electronics. It is thus necessary to transfer the layer of epitaxially grown material to a target support with more appropriate properties (thermal and electrical conductivity, optical properties, etc) or to detach the epitaxially grown layer from the support when it is sufficiently thick to be self-supporting. The support must always be detached from the remainder of the growth structure, in a manner that is non-destructive for the support in order to allow it to be recycled.

European patent EP-A-0 898 307 describes how to unbond a thin wafer covered with integrated circuits bonded to a support substrate that provides the rigidity necessary to the wafer for easier manipulation during the treatments that have to be carried out on the integrated circuits. The document describes unbonding at the bonding interface between the wafer and the support by use of an oxide bonding layer formed by PECVD. That oxide has the peculiarity of having OH species that diffuse to the bonding interface under the action of a heat treatment (600° C. to 1350° C.) carried out after bonding stabilization annealing and the desired treatments carried out on the integrated circuits. Said species develop until a gas is formed and constitutes bubbles that diffuse and that are concentrated locally at the bonding interface, i.e. the interface located between the substrate and the oxide bonding layer deposited on the wafer. That phenomenon encourages weakening of the bonding interface until the support substrate unbonds completely at its interface with the bonding layer, thereby liberating the wafer that is integral with the bonding layer from the support so that the integrated circuits can be used.

International patent document WO-A-02/084722 describes the fabrication of a substrate that can be released via a specific interface, or intermediate layer, having mechanical strength that is kept to a controlled level, compatible with subsequent release. Said release may take place after forming the components on the substrate or an epitaxy step. That interface is created by treating one of the surfaces to be bonded to control its roughness or its hydrophilic characteristics and to allow assembly of the substrates with a force that is sufficient to carry out the subsequent steps but that is compatible with subsequent release. Said release may be accomplished by an external mechanical, chemical, and/or photonic action. The mechanical strength of the interface may be reinforced if necessary by heat treatments while remaining compatible with subsequent detachment.

WO-A-2005/034218 describes bonding a substrate and a superstrate of silicon, each of which has a thermal oxide layer formed thereon. An intermediate layer of oxide of silicon is formed on one of them. It is doped with phosphorus and/or boron to form a PSG (phosphor-silicate glass) or PBSG (boro-phospho-silicate glass) type material that can be deformed plastically. Applying a heat treatment to the structure at 900° C. to 1100° C. causes the irreversible formation of micro-bubbles or microcavities in the bonding layer. Said micro-bubbles may be used for a variety of applications and in particular to weaken the bonding interface to allow the structure to be dismantled.

WO-A-2005/074022 describes the fabrication of a "liberatable" structure since the two principal layers may be liberated from each other by an external action, for example a mechanical action. Bonding is achieved via a reversible connection obtained by forming a layer of a first material comprising within it a second material such as silicon or germanium that is capable, following a heat treatment, of generating nano-particles that are different from the first material. The layer of first material may be formed from deposited or thermally formed $SiO_2$. The bonding force procured by that type of connection is not modified during subsequent heat treatments. The connection may then be used to liberate the two substrates by the action of a mechanical force.

The detachment solutions described in those documents cannot be used with structures that are intended to carry out epitaxial growth and that comprise materials with high thermal expansion coefficients such as sapphire, lithium tantalate, etc. In fact, the bonding force obtained with the methods described in those documents is too low to be able, during heat treatments, to withstand the thermal expansion stresses induced by the materials used, or, during heteroepitaxy, to withstand the stresses induced by the crystalline lattice parameter differences. With such materials, too low a bonding force means that a good quality structure for epitaxy cannot be formed, nor can the moment of detachment of the support substrate be controlled by applying an appropriate thermal budget. In fact, when bonding is too weak, the support substrate risks becoming detached from the seed film at any time during the epitaxy process.

SUMMARY OF THE INVENTION

The invention aims to overcome the above-mentioned disadvantages and it proposes a solution allowing epitaxial growth, in particular of materials from group III/N, on composite structures comprising a thin film and a support substrate produced with materials that have high thermal expansion coefficients ($7 \times 10^{-6}$ $K^{-1}$ or more over the temperature range under consideration (20° C. to 1200° C.)) and wherein bonding between the thin film and the support substrate is capable of withstanding the stresses and the temperatures employed for at least a predetermined period of epitaxy, while allowing detachment of the support substrate by rupture of the bonding layer at a predetermined moment, i.e. before or after the end of epitaxy, or at the same time as the end of epitaxy.

This aim is achieved by a method of fabricating materials by epitaxy, the method comprising a step of epitaxial growth of at least one layer of a material on a composite structure comprising at least one thin film bonded to a support substrate, a bonding layer being formed by deposition between the support substrate and the thin film, the method of the invention being characterized in that the bonding layer of oxide is formed by low pressure chemical vapor deposition (LPCVD) of a layer of oxide of silicon on the bonding face of the support substrate and/or on the bonding face of the thin film, in that the thin film has a thickness that is less than or equal to the thickness of said oxide layer, and in that the method includes a heat treatment carried out at a temperature that is higher than the temperature for depositing the layer of oxide of silicon and for a predetermined period.

Thus, by using a composite structure with a layer of oxide of silicon formed by LPCVD and with a thickness that is greater than or equal to that of the thin film, it is possible to control the phenomenon of the formation of microcavities buried in the bonding layer of oxide leading to delamination and to detachment of the support substrate in order, initially, to avoid deformation of the thin film and detachment of the support substrate over a limited period and then to activate the formation of microcavities in order to provoke detachment of the support substrate by rupture of the layer of oxide of silicon at the desired moment, i.e. before or after the end of epitaxy, or at the same time as the end of epitaxy.

As explained below in detail, using a bonding layer formed by LPCVD deposition with a thickness that is greater than that of the thin film prevents plastic (irreversible) deformations within the bonding layer. Thus, the formation of microcavities in the deposited bonding layer of oxide of silicon does not lead to delamination of the thin film nor does it buckle the surface of the film, even during heat treatments at a temperature that is higher than the oxide deposition temperature. Following a study, detailed below, concerning the temperature behavior of layers of oxide of silicon as a function of the deposition technique employed, the Applicant has determined that deposition by LPCVD can produce oxides with a temperature stability that is close to that of oxides obtained by thermal oxidation. Further, to withstand stresses due to the large difference between the low thermal expansion coefficient of the bonding layer of oxide of silicon and the high expansion coefficients of the materials of the composite structure, the thickness of the layer of oxide of silicon is greater than or equal to that of the thin film. This means that the stresses applied at the bonding layer during high temperature epitaxial growth can be reduced, as well as the risk of plastic deformations occurring in this bonding layer.

In order to detach the substrate at a predetermined moment (during or after epitaxial growth), it is necessary to apply a heat treatment at a temperature that is at least higher than the temperature at which the oxide of silicon is deposited, during a predetermined period that is a function of that temperature. The composite structure of the invention comprises a deposited bonding layer of oxide of silicon that is designed not to creep readily at the temperatures and stresses to which it is subjected during epitaxy. Since creep of the oxide results in the formation of microcavities, it is possible to initiate the formation of microcavities at a predetermined moment during epitaxy or thereafter by applying a heat treatment at a temperature that is above the oxide deposition temperature. This heat treatment can obtain creep of the bonding layer of oxide by increasing both the temperature of the oxide and that of the composite structure, causing the generation of stresses due to differences in the thermal expansion coefficients.

The bonding layer of oxide formed by low pressure chemical vapor deposition has a thickness that is greater than the thickness of the thin film and is preferably in the range from approximately 0.2 µm [micrometer] to 0.75 µm, and more preferably in the range approximately 0.2 µm to 0.45 µm.

The epitaxial growth step may partially or completely contribute to the heat treatment to obtain creep of the oxide of silicon and the development of microcavities. The temperature during epitaxial growth is then higher than the oxide deposition temperature. Knowing this temperature, it is possible to determine the time after which development of the microcavities is such that it sufficiently weakens the oxide layer to allow it to rupture. Epitaxy may be carried out to provide only a part of the heat treatment necessary for rupture of the oxide layer. However, epitaxy may also be carried out over a period that can produce rupture of the oxide layer; in similar vein, it can be continued after rupture of the layer so as to produce the desired thickness of epitaxially grown material.

The heat treatment step may also be carried out after the epitaxial growth step. This applies in particular when epitaxy is carried out at a temperature below the oxide deposition temperature.

In one aspect of the invention, the heat treatment is carried out for a period that can of itself provoke detachment of the support substrate. Under such circumstances, the heat treatment that can initiate the formation of microcavities is carried out for a period that can develop the microcavities sufficiently to obtain splitting/fracture at the bonding layer of oxide.

In a further aspect, the detachment method further comprises, after the heat treatment step, a complementary step of applying a mechanical separation stress at the bonding layer of oxide to provoke detachment of the support substrate. This complementary step may also consist of a chemical attack of the bonding layer of oxide to provoke detachment of the support substrate. Either way, because of the prior formation of microcavities, the heat treatment can weaken the bonding layer of oxide so that fracture/splitting is then readily obtained by mechanical or chemical action.

The material of the bonding layer formed by low pressure chemical vapor deposition is an oxide of silicon formed from precursors selected from silane, dichlorosilane and TEOS.

In accordance with one aspect of the invention, the method further comprises, prior to bonding, a step of densification heat treatment of the layer of oxide of silicon deposited by low pressure chemical vapor deposition on the bonding face of the support substrate and/or on the bonding face of the thin film. This densification heat treatment step can further increase the temperature behavior of the deposited oxide of silicon vis-à-vis the formation of microcavities. This step can, if necessary, reduce the ratio of the thicknesses of the thin film and of the deposited layer of oxide of silicon.

The densification heat treatment step is carried out at a temperature that is higher than the temperature for deposition of the bonding layer of oxide but over a much shorter period than that which provokes rupture of the layer of oxide of silicon.

In accordance with one particular characteristic of the method of the invention, the thin film may be obtained using the Smart Cut® technique. The method then further comprises:

a step of implantation, by bombardment of one face of a donor substrate using ions to form, at a predetermined depth in the substrate, a layer of weakness defining the thin film in the upper portion of the substrate;

a step of bonding, by placing the donor substrate in intimate contact with the support substrate;

a step of detachment of the thin film in contact with the support substrate, by splitting at the layer of weakness formed in the donor substrate.

In accordance with a particular characteristic of the invention, the thin film may be produced with:

a step of bonding, by bringing a donor substrate into intimate contact with the support substrate;

a step of thinning the donor substrate to form the thin film.

After the bonding step, a step of bonding stabilization annealing may be carried out at a temperature that is higher than that at which the oxide of silicon is deposited without microcavities appearing in the deposited layer of oxide.

In particular, the invention relates to the production of at least one layer of binary, ternary, or quaternary type III/V and III/N material such as GaN, AlGaN, InGaN, or InAlGaN.

In accordance with one aspect of the invention, the epitaxial growth is carried out for a predetermined period corresponding to the formation of a thickness of semiconductor material or a cumulative thickness of a layer of semiconductor material and thin film of at least 10 micrometers. This thickness is sufficient for the layer of conductive material, alone or with the thin film, to have a sufficient mechanical strength and flatness, if it is not manipulated, to withstand the conditions for epitaxy. Thus, a new epitaxial growth step of the same material or another III/N material may be carried out in the same epitaxy equipment.

In accordance with another aspect of the invention, epitaxial growth is carried out for a predetermined period corresponding to the formation of a thickness of semiconductor material or a cumulative thickness of a layer of semiconductor material and thin film of at least 100 micrometers. Such a thickness means that it is possible to form a layer of semiconductor material or a "self-supported" material layer/thin film assembly, i.e. that is sufficiently rigid and strong to be manipulated without the need for a support.

The free surface of the layer of epitaxially grown semiconductor material may be bonded to a target support before detaching the support substrate.

DETAILED DESCRIPTION OF IMPLEMENTATIONS OF THE INVENTION

The present invention proposes the production of a composite structure allowing both the formation by epitaxy of layers of type III/N materials of good quality and detachment of the support substrate from the composition structure before or after the end of epitaxy, or substantially at the same time as the end of epitaxy.

To this end, the invention proposes a novel concept of a composite structure comprising a bonding layer of oxide located between the support substrate and the thin film and in which the formation of microcavities can be controlled. The composite structure of the invention means that microcavities in the bonding layer of oxide can be controlled both as regards preventing their appearance during heat treatments applied to the structure before and during at least a portion of the epitaxy and encouraging their formation or even their development during epitaxy or thereafter with a view to detachment of the support substrate.

The composite structure comprises at least one thin film of semiconductor material bonded to a support substrate via a bonding layer of oxide of silicon between the support substrate and the thin film, the thin film and the support substrate having a mean thermal expansion coefficient of $7 \times 10^{-6} K^{-1}$ or more over a temperature range of 20° C. to 1200° C. in order to be able to reach a certain level of stress in the structure by application of a heat treatment.

When bonding two substrates of materials different from silicon or silicon carbide (SiC), such as sapphire in particular, it is not possible to form a layer of oxide of silicon by consumption of silicon from the substrate by thermal oxidation. It is thus necessary to form the oxide of silicon by deposition using a technique such as plasma enhanced chemical vapor deposition (abbreviated to PECVD) or low pressure chemical vapor deposition (abbreviated to LPCVD). This is then a "deposited oxide" which, in contrast to a thermal oxide, is not stoichiometric (the oxide deposited has a composition of the type $Si_xO_yH_z$). Further, this deposited oxide is less dense and does not have the same properties as the thermal oxide. Even after densification annealing, this deposited oxide of silicon is still temperature-unstable, in particular during high temperature treatments (>800° C.)

When a composite substrate, formed by a sapphire support substrate on which a thin layer of sapphire is laid, is heated to prepare it for GaN epitaxy, for example, microcavities appear exclusively at the bonding layer of deposited oxide of silicon once the oxide deposition temperature is exceeded. They are visible at the surface of the thin film of sapphire by the formation of irreversible blisters which "buckle" its surface and render it unsuitable for epitaxy because the surface is no longer smooth and the lattice parameter is distorted.

The microcavities are larger when the thermal expansion coefficients of the materials used are high, compared with that of the deposited oxide of silicon, at the temperatures reached during fabrication of the composite structure or during its subsequent use (epitaxy). In general, the formation and development of microcavities within the deposited layer of oxide of silicon has been observed at any temperature exceeding the oxide of silicon deposition temperature.

The appearance of microcavities in the oxide of silicon may be explained by the transition from an elastic mode of deformation to a plastic mode of deformation, which is thus not reversible. Elastic deformation is characterized by a modification of the initial state of the oxide, for example under the action of a mechanical stress, and its return to the initial state once the stress is withdrawn. Plastic deformation results in irreversible deformation, after which the oxide cannot regain its initial state once the mechanical stress is withdrawn. The transition to plastic deformation occurs when a threshold for the various parameters is reached in the oxide. This transition is linked to the temperature, to the creep characteristics of the oxide of silicon and to the stress applied by the difference in the expansion of the bonded materials and of the oxide. The creep temperature of the oxide of silicon is one of the characteristics of the oxide that indicates the temperature beyond which the oxide changes from an elastic deformation mode to a plastic deformation mode when it is not subjected to a stress. Temperature increases the amount of creep of the oxide. Thus, the level of stress to be applied to provoke the formation of microcavities in the deposited layer of oxide is lower when the oxide has an intrinsic capacity to creep easily, especially due to the temperature applied vis-à-vis its creep temperature.

As a result, to control the formation of microcavities in the bonding layer of oxide so that they only actually appear at the desired time (during or after epitaxy), it is necessary to use both a deposited oxide of silicon where creep is difficult to provoke and to reduce the stresses applied to the oxide of silicon during high temperature treatments applied prior to or during epitaxy.

The Applicant has studied the temperature behavior of oxides obtained by different deposition techniques and has discovered that an oxide of silicon deposited by low pressure chemical vapor deposition, also termed LPCVD, can reduce its capacity to creep. The experiments carried out by the Applicant have shown that the properties of the oxide have a substantial influence on the formation of microcavities in the bonding layer and that these properties can be influenced by the deposition technique employed and by the precursor used.

The following three types of oxides of silicon were tested for bonding of a thin film of sapphire onto a sapphire support substrate:

- oxide of silicon produced from a silane precursor, deposited at 300° C. by plasma enhanced chemical vapor deposition or PECVD;
- oxide of silicon produced from a silane precursor deposited at 800° C. by LPCVD (also termed HTO silane, HTO meaning high temperature oxide) (if the oxide is deposited by PECVD, and thus at a lower temperature, it is not termed HTO silane); and
- oxide of silicon produced from a dichlorosilane (DCS) precursor deposited at 900° C. by LPCVD (also termed HTO DCS).

Microcavity formation is less significant with HTO silane and HTO DCS. In contrast, microcavity formation is more significant with the oxide of silicon deposited by PECVD deposition. It thus appears that creep of the deposited oxides is more difficult to provoke when they are deposited by the LPCVD technique.

In addition, the temperature behavior of the deposited oxide may be improved by using an oxide of silicon obtained by LPCVD deposition that has a density that is as close as possible to that of the thermal oxide. To this end, a densification anneal may be applied to the oxide of silicon deposited by LPCVD prior to bonding.

With a composite structure comprising a 0.5 µm thick thin film of sapphire on a sapphire support substrate with a 0.2 µm thick bonding layer of HTO DCS oxide of silicon, a bonding stabilization anneal carried out at 900° C. for 1 hour provokes complete delamination of the sapphire film. In contrast, when the HTO DCS oxide of silicon with the same composite structure is annealed for 30 minutes at 1200° C. in a nitrogen atmosphere ($N_2$) before carrying out bonding, a bonding stabilization anneal carried out at 1050° C. for 1 hour does not lead to delamination of the thin film.

Furthermore, since the formation of microcavities is linked to the stress due to high thermal expansion coefficients of the materials of the structure, the invention also proposes reducing that stress by forming (by transfer or by mechanical or chemical thinning) a thin film with a thickness that is less than or equal to that of the deposited layer of oxide of silicon. Thus, mechanical stresses, derived from the difference in expansion during heat treatments carried out on the structure before or during part of the epitaxy, may be limited so that they do not exceed the plastic deformation (creep) threshold of the oxide of silicon at the temperature under consideration.

As an example, the Applicant has carried out tests which showed that when a film of sapphire with a thickness of 0.5 µm was transferred onto a 0.3 µm thick bonding layer of HTO silane oxide of silicon deposited by LPCVD, delamination of the film occurred after a heat treatment carried out at 1100° C. for 1 hour. In contrast, when a 0.3 µm thick film of sapphire was transferred onto a bonding layer that was also 0.3 µm thick of HTO silane oxide of silicon deposited by LPCVD, no delamination occurred after a heat treatment carried out at 1100° C. for 3 hours. In general and in accordance with the invention, the higher the thermal expansion coefficient of the material of the thin film, the thinner it must be relative to the thickness of the deposited layer of oxide of silicon in order to reduce the stresses in the structure. As an example, the thickness of the thin film should be significantly reduced relative to that of the deposited layer of oxide of silicon when the thin film is formed from lithium tantalate ($LiTaO_3$) that has a thermal expansion coefficient of $16 \times 10^{-6} K^{-1}$ at ambient temperature.

In accordance with the invention, the thickness of the bonding layer of oxide formed by LPCVD deposition is preferably in the range from approximately 0.2 µm to 0.75 µm and more preferably in the range from approximately 0.2 µm to 0.45 µm.

The formation and development of microcavities in the bonding layer of oxide formed by deposition result from applying a thermal budget. The temperature/period couple corresponds to the thermal budget of a heat treatment.

In addition, when the epitaxial growth is carried out at a temperature that is higher than the temperature at which the layer of oxide of silicon is deposited, it is possible, as a function of the temperature of the epitaxial growth, to determine the period after which the oxide layer is sufficiently weakened to be broken, for example during epitaxy or by extending the heat treatment after epitaxy, or by a complementary mechanical or chemical action.

When epitaxial growth is carried out at a temperature that is lower than the deposition temperature of the oxide layer, to allow detachment of the support substrate after epitaxy, it is necessary to apply an additional heat treatment step with a thermal budget that can at least initiate the formation of microcavities in the bonding layer of oxide in order to weaken the bond between the support substrate and the thin film; detachment of the support substrate is obtained by rupture of the thus weakened bonding layer of oxide. Fracture may be obtained by developing the microcavities formed by extending the heat treatment for initiating formation of the microcavities.

However, fracture may also be obtained by applying a mechanical stress, for example by introducing a blade between the support substrate and the thin film or by applying tensile forces or shear forces to these two elements. It is then possible to obtain fracture more easily, more precisely and in a more localized manner than with a non-weakened bonding layer of oxide, i.e. not comprising microcavities.

Detachment of the support substrate may also be obtained by means of a chemical attack of the weakened oxide layer, for example using a dilute hydrofluoric acid (HF) solution or BOE (buffered oxide etch, which includes concentrated HF). Without the microcavities, the oxide of silicon takes several hours to dissolve, while in the presence of microcavities, separation between the thin film and the support substrate is achieved in a few minutes or a few tens of minutes.

When epitaxy is carried out at a temperature that is higher than the temperature at which the oxide of silicon is deposited but with a thermal budget that is insufficient to achieve the necessary development of the microcavities and obtain rupture of the bonding layer of oxide, the heat treatment must be extended beyond the epitaxy with a thermal budget which means that formation of the microcavities in the deposited oxide layer can be continued until rupture occurs. This thermal budget is a budget that is complementary to that of the epitaxy, in particular as regards the temperature that must be higher than that of the epitaxy if the rate of development of the microcavities is to be enhanced. The period of the heat treatment thus depends on the temperature used. The temperature/period couple, which defines the thermal budget to be applied for microcavity formation, has to be modulated as a function of the stress brought about by the difference in thermal expansion of the materials constituting the composite structure and the deposited layer of oxide of silicon during heat treatment and the ratio of the thickness of the thin film to the layer of oxide of silicon. Take as an example a structure of a SapoS (sapphire on sapphire) type that has a thin layer of 0.4 µm bonded by a layer of oxide of silicon with a thickness of 0.4 µm deposited at 800° C. using the LPCVD technique with silane as the precursor gas and densified at 1100° C. for 2 hours in nitrogen. The structure is used to epitaxially grow 100 µm of GaN, requiring a thermal budget of 1100° C. for 2 hours. The complementary budget to obtain fracture is thus be 1200° C. for 2 hours. If the temperature is lower, the period must be increased to accomplish the formation and development of microcavities to fracture.

Thus, a composite structure fabricated in accordance with the invention can withstand temperatures greater than that for deposition of the oxide of silicon for the epitaxy of materials such as materials of type III/N including GaN and other ternary or quaternary alloys.

The composite structure of the present invention is particularly suitable for materials with high thermal expansion coefficients (TEC), i.e. a mean of $7 \times 10^{-6}$ $K^{-1}$ or more over the temperature range to which the structure is to be subjected, typically 20° C. to 1200° C. In particular, the structure may comprise a thin film and/or the support substrate formed from sapphire ($Al_2O_3$) (TEC of $7.5 \times 10^{-6}$ $K^{-1}$), lithium tantalate ($LiTaO_3$) (TEC of $16 \times 10^{-6}$ $K^{-1}$), $LiNbO_3$ (TEC of $15 \times 10^{-6}$ $K^{-1}$) and Haynes® 230® Alloy (TEC of $11.8 \times 10^{-6}$ $K^{-1}$), which is a commercial alloy primarily composed of Ni, Cr, Mo, W (Haynes® 230® Alloy is not used for the thin film when the film is intended for use as a seed layer for epitaxy), or MgO.

As is well known, as a function of the nature of the crystalline seed layer for growth (thin film), various binary, ternary, or quaternary III/V, or III/N semiconductor materials may be formed. In particular, the composite structure for epitaxy of the invention is intended for the epitaxial growth of GaN, AlN, InGaN, AlGaN, AlGaInN, BGaN, and indium nitride (InN). The epitaxially grown layer may also be composed of a stack of these various materials, in particular to constitute the active layers of an LED.

A method of fabricating a layer of semiconductor material by epitaxy comprising prior production of a composite structure and detachment from the support substrate after epitaxy in accordance with an implementation of the invention is described with reference to FIGS. 1A to 1L and 2.

Before carrying out epitaxy proper, a composite structure is produced that can allow both the formation by epitaxy of at least one layer of material and the detachment of the support substrate after epitaxy.

Figure 1A:
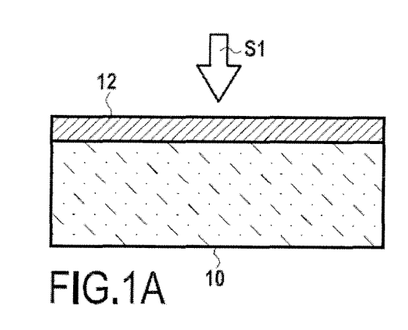
FIGS. 1A to 1L are diagrammatic sectional views showing the production of a composite structure, epitaxy and detachment of the support substrate in accordance with one implementation of the invention.

Production of the composite structure for epitaxy commences by depositing a bonding layer 12 on one face of a support substrate 10 (step S1, FIG. 1A). In the example described here, the support substrate 10 is formed from sapphire ($Al_2O_3$). The bonding layer 12 is a layer of oxide of silicon deposited by LPCVD with silane as the precursor gas (HTO silane) at a deposition temperature of 800° C., a pressure of 1 torr and for a period allowing the deposition of a layer of oxide approximately 0.4 µm thick. The deposited oxide of silicon is then densified by applying a densification anneal carried out at 1200° C. for 30 minutes in a nitrogen atmosphere (step S2).

A layer of oxide of silicon 13 is also formed on a donor substrate 11 of sapphire. The layer 13 is a layer of oxide of silicon deposited by LPCVD with silane as the precursor gas (HTO silane) at a deposition temperature of 800° C., at a pressure of 1 torr and for a period allowing the deposition of a thickness of oxide of silicon of approximately 0.5 µm (step S3, FIG. 1B). The deposited oxide of silicon is then densified by application of a densification anneal carried out at 1200° C. for 30 minutes in a nitrogen atmosphere at atmospheric pressure (step S4).

Figure 1B:
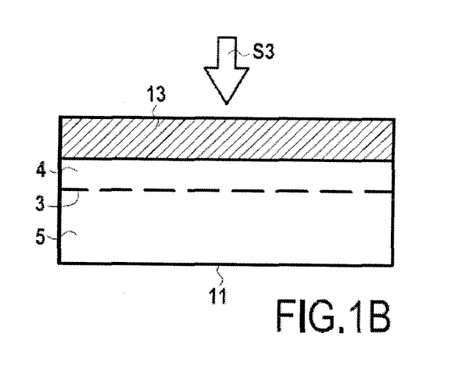

The donor substrate 11 also comprises a layer of defects or weakness 3 that has been obtained, in known manner, by implanting ionic species such as hydrogen ions or co-implanting hydrogen and helium ions, carried out at an implantation dose in the range $1 \times 10^{17}$ atoms/cm² [atoms/square centimeter] to $4 \times 10^{17}$ atoms/cm² and with an implantation energy in the range 30 keV [kilo-electron volt] to 200 keV. Implantation is carried out at a temperature in the range 20° C. to 400° C., preferably in the range 50° C. to 150° C., for a period of 1 minute to 10 hours. These implantation conditions can create, at a predetermined depth that is less than the cumulative thickness of the oxide layers 12 and 13, in the donor substrate 11, the layer of defects or weakness 3 defining firstly a thin film 4 in the upper region of the substrate 11 and secondly a portion 5 in the lower region of the substrate corresponding to the remainder of the substrate 11.

Figure 1C:
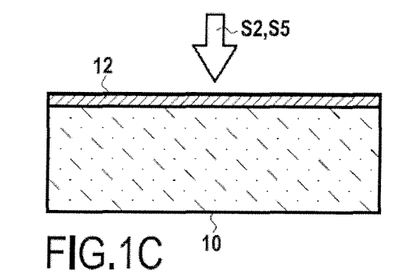
Figure 1D:
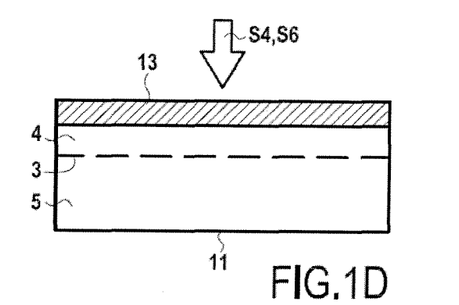

The surface of the bonding layers of oxide 12 and 13 is planarized by chemical mechanical polishing (CMP) to obtain a surface roughness of less than 5 Å [Angstrom] rms [root mean square] over a surface area of 5×5 µm² to thereby facilitate the subsequent intimate contact step (steps S5 and S6, FIGS. 1C and 1D). Thus, after polishing, the cumulative thickness of layers 12 and 13 is 0.45 µm±0.05 µm.

Figure 1E:
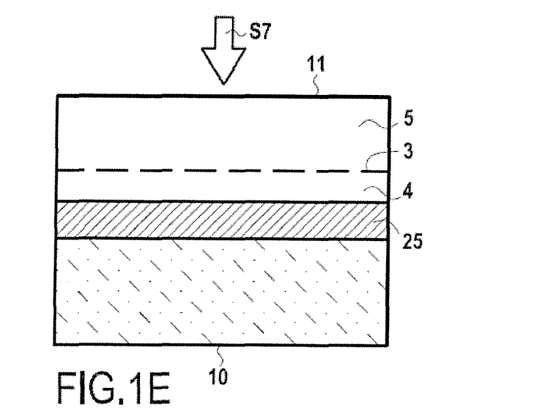

Next, bonding is carried out by bringing the face of the HTO silane layer 12 into intimate contact with the layer of HTO silane 13 of the donor substrate 11, the combined layers 12 and 13 forming a bonding layer of oxide 25 (step S7, FIG. 1E). Bonding is carried out by wafer bonding. The principle of bonding by wafer bonding is well known per se and is not described in further detail. It should be recalled that bonding by wafer bonding is based on bringing two surfaces into intimate contact, i.e. without the use of a specific material (adhesive, wax, low melting point metal, etc), the attractive forces between the two surfaces being high enough to provoke molecular bonding (bonding induced by the ensemble of the attractive forces (Van der Waals forces) of electronic interaction between atoms or molecules of the two surfaces to be bonded).

Figure 1F:
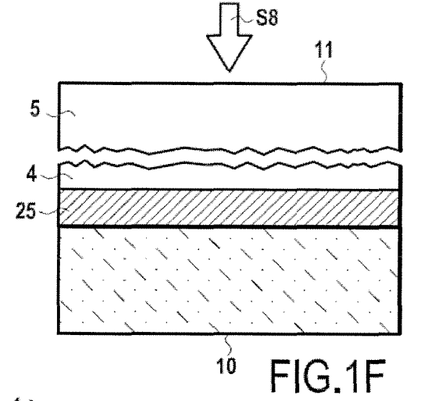

The assembly of the two substrates then undergoes splitting annealing to provoke fracture of the donor substrate 11 at the plane of weakness 3 and transfer proper of the 0.4 µm thick thin film 4 onto the support substrate 10 (step S8, FIG. 1F). Splitting annealing is carried out by ramping up the temperature from ambient to approximately 600° C. As is well known, the temperature and duration of the splitting anneal are defined as a function of the implantation conditions and in particular as a function of the implantation dose.

In addition, a bonding stabilization anneal is carried out at 1050° C. in nitrogen for 1 hour without deformations appearing on the surface of the thin film 4 (step S9).

Figure 1G:
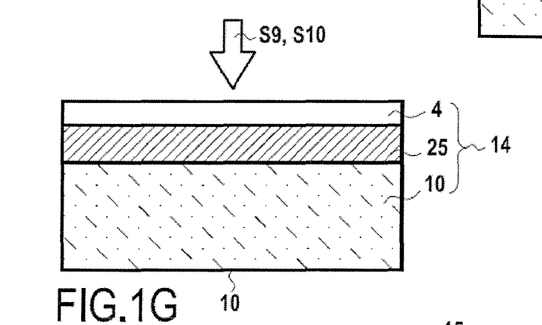

The surface of the film 4 may then be prepared for epitaxy, for example by polishing to obtain a surface roughness of less than 5 Å rms over a surface area of 5×5 µm$^2$ (step S10, FIG. 1G).

As can be seen in FIG. 1G, a composite structure 14 is obtained comprising the support substrate 10, an oxide bonding layer 25 of HTO silane deposited by LPCVD and a thin film 4 of sapphire that may act as a crystalline seed layer for growth.

Figure 1H:
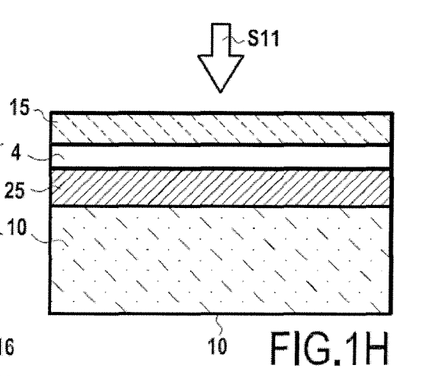

In the example described here, epitaxial growth of a layer of gallium nitride (GaN) 15 is carried out on the thin film 4 (step S11, FIG. 1H). Epitaxial growth is carried out at 1050° C. for 2 to 3 hours in order to obtain a layer of approximately 10 µm or more of GaN, for example using hydride vapor phase epitaxy, HVPE. No delamination was observed after said epitaxy. Since the GaN epitaxy is carried out at a temperature that is higher than that for deposition of the oxides of silicon, the thermal budget supplied by the epitaxy contributed to the budget necessary for the development of microcavities. However, the microcavities created are not sufficiently developed to accomplish the weakening of the oxide layer that is necessary for detachment. The epitaxially grown layer 15 may also have a more complex structure, termed the electroluminescent diode layer, which is constituted by several materials such as GaN, InGaN, or AlGaN formed in succession by epitaxy.

Figure 1I:
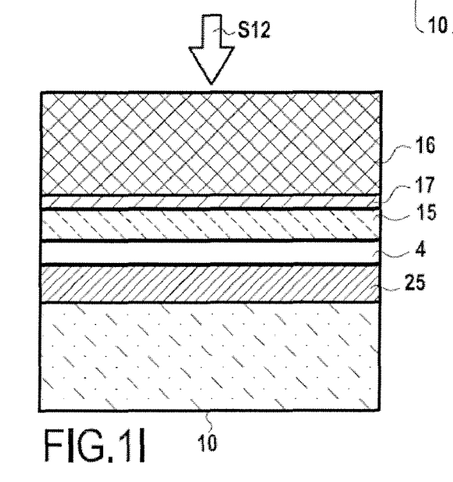
Figure 1J:
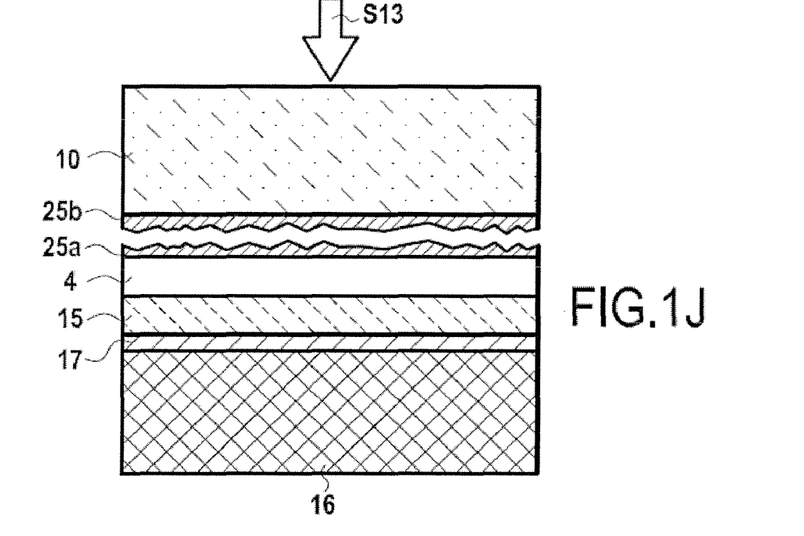

Once the layer of GaN 15 is formed, its free face is bonded to a final support 16 of silicon via a metal bonding interface 17 (step S12, FIG. 1I). Next, complete detachment of the support substrate 10 could be carried out. Said detachment is achieved here by applying a mechanical stress to finalize detachment of the structure at the cavities formed in the oxide during the epitaxial growth step but that are insufficient to provoke spontaneous separation of the bonding layer of oxide 25 into two portions 25a, 25b (step S13, FIG. 1J).

Figure 1K:
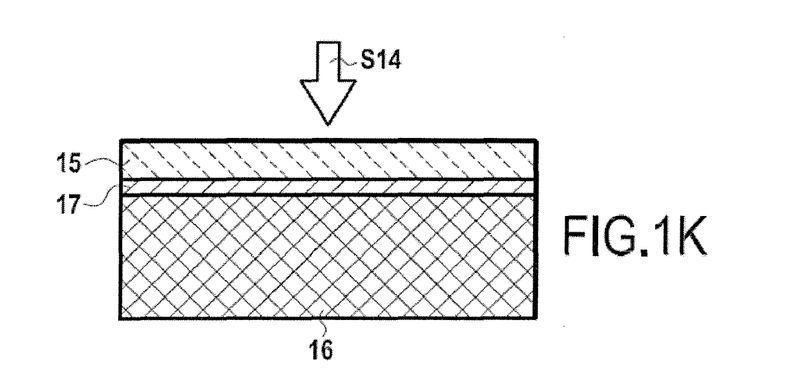
Figure 1L:
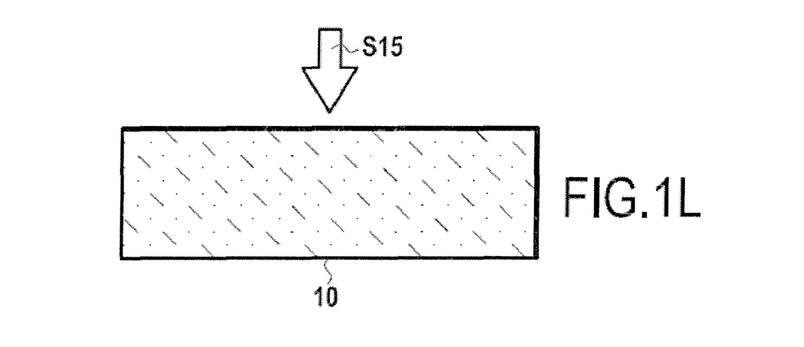
Figure 2:
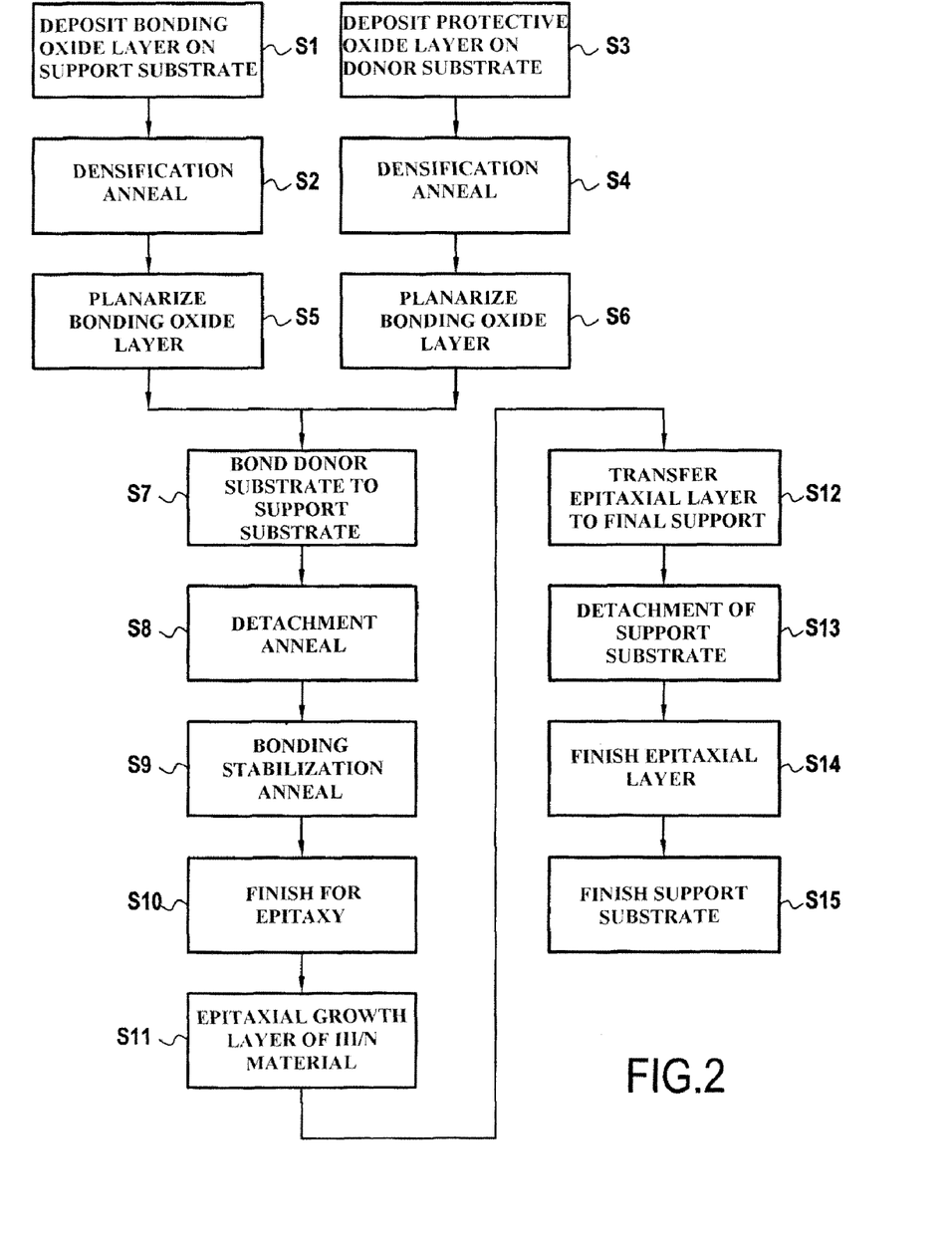
FIG. 2 is a flowchart of the steps carried out in FIGS. 1A to 1L.

The remainder 25a of the bonding layer of oxide and the thin film 4 are removed from the surface of the GaN layer 15 by chemical etching and/or polishing (step S14, FIG. 1K).

The remainder 25b of the bonding layer of oxide is also removed from the support substrate 10 that can then be recycled, for example to form a new composite structure for epitaxy as described above (step S15, FIG. 1L).

The partial development of microcavities during epitaxy of the layer 15 prior to bonding between the two materials with very different thermal expansion coefficients (sapphire and silicon) means that the thermal budget to be supplied to result in detachment can be reduced. This can also prevent the generation of stresses that are too high in the structure during the splitting heat treatment, said stresses possibly resulting in shattering of the bonded structure.

Another implementation of the method of fabricating a layer of semiconductor material by epitaxy in accordance with the invention and comprising the prior production of a composite structure and detachment of the support substrate during epitaxy is described below.

Figure 3A:
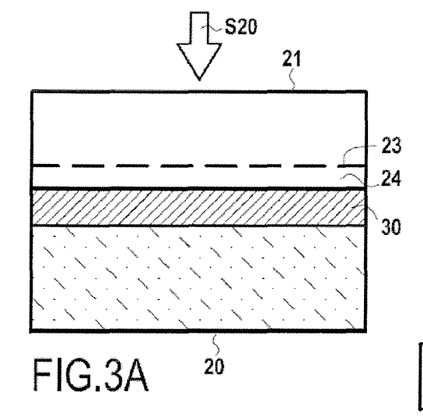
FIGS. 3A to 3G are diagrammatic sectional views showing the production of a composite structure, epitaxy and detachment of the support substrate during epitaxy in accordance with another implementation of the invention.

Production of the composite structure for epitaxy commences by bringing a support substrate 20 formed from sapphire (Al$_2$O$_3$) into intimate contact with a donor substrate 21 formed from sapphire each covered with a layer of oxide of silicon deposited by LPCVD using a silane precursor gas and wherein the surface has a roughness of 5 Å rms over a surface area of 5×5 µm$^2$ (step S20, FIG. 3A). These layers of oxide of silicon are not densified, their combination forming a bonding layer of oxide 30 with a cumulative thickness of approximately 0.5 µm.

The donor substrate 21 also comprises a layer of defects or weakness 23 that is obtained by implanting ionic species under conditions that can readily be determined by the skilled person (implantation dose and energy) in order to obtain a thickness of the film 24 of 0.5 µm.

Bonding is carried out by wafer bonding.

Figure 3B:
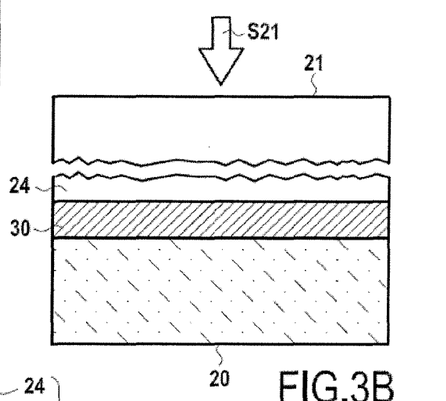

The assembly of the two substrates then undergoes a splitting anneal to provoke fracture of the donor substrate 21 at the plane of weakness 23 and transfer proper of the thin film 24 onto the support substrate 20 (step S21, FIG. 3B). The splitting anneal is carried out using a temperature ramp-up from ambient to approximately 600° C.

No bonding stabilization annealing is carried out. The surface of the film 24 is thus prepared to act as a crystalline seed for growth for epitaxy, for example by polishing to obtain a surface roughness of less than 5 Å rms over a surface area of 5×5 µm$^2$ (step S22, FIG. 3C).

Figure 3C:
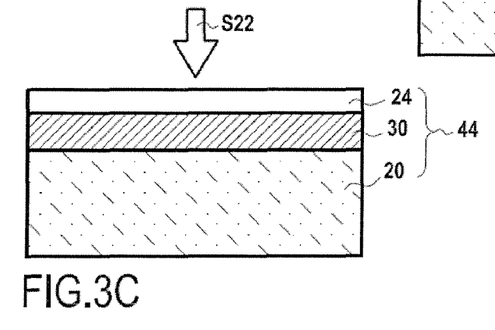
Figure 3D:
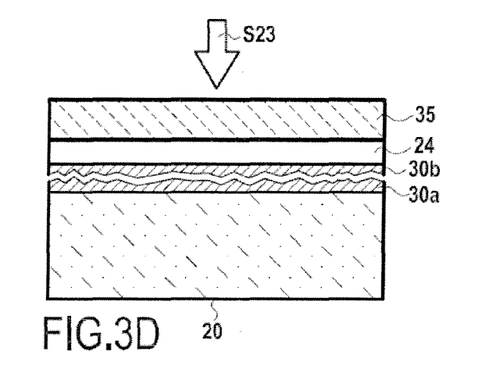
Figure 3E:
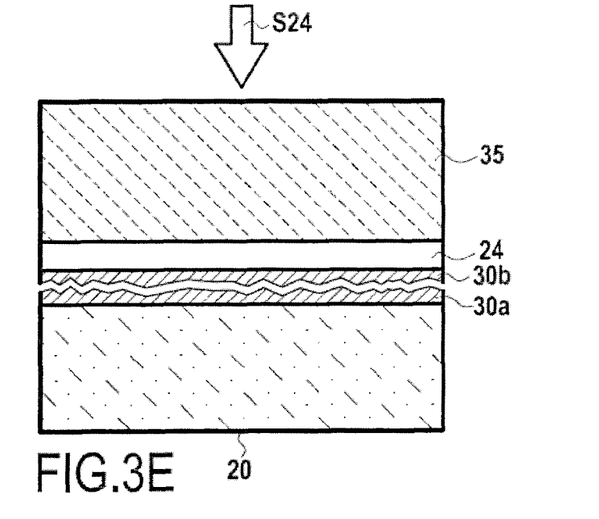

A composite structure 44 is obtained comprising the support substrate 20, a bonding layer of oxide of silicon 30 (LPCVD, silane, 0.5 micrometer thick) and a thin film 24 of sapphire 0.5 µm thick that could act as a crystalline seed layer for growth.

In the example described here, epitaxial growth of a layer of gallium nitride (GaN) 35 is carried out on the thin film 24. Epitaxy is carried out at 1100° C. for 2 hours that could produce a layer of GaN of approximately 100 µm and rupture of the layer of oxide of silicon 30 (step S23, FIG. 3D). The split structure is left in place (the support is not removed from the remainder of the structure) and epitaxy is continued to obtain a layer of GaN 35 of approximately 1 mm (step S24, FIG. 1E).

Figure 3F:
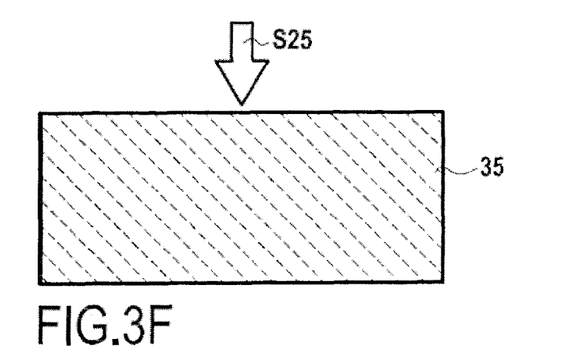
Figure 3G:
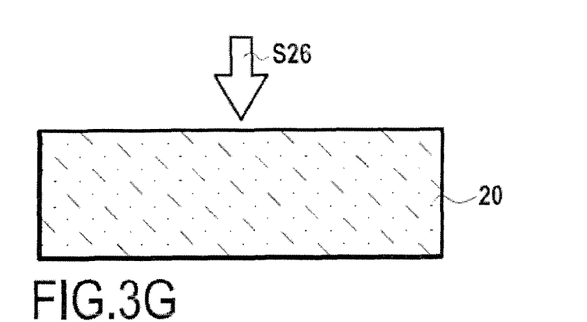
Figure 4:
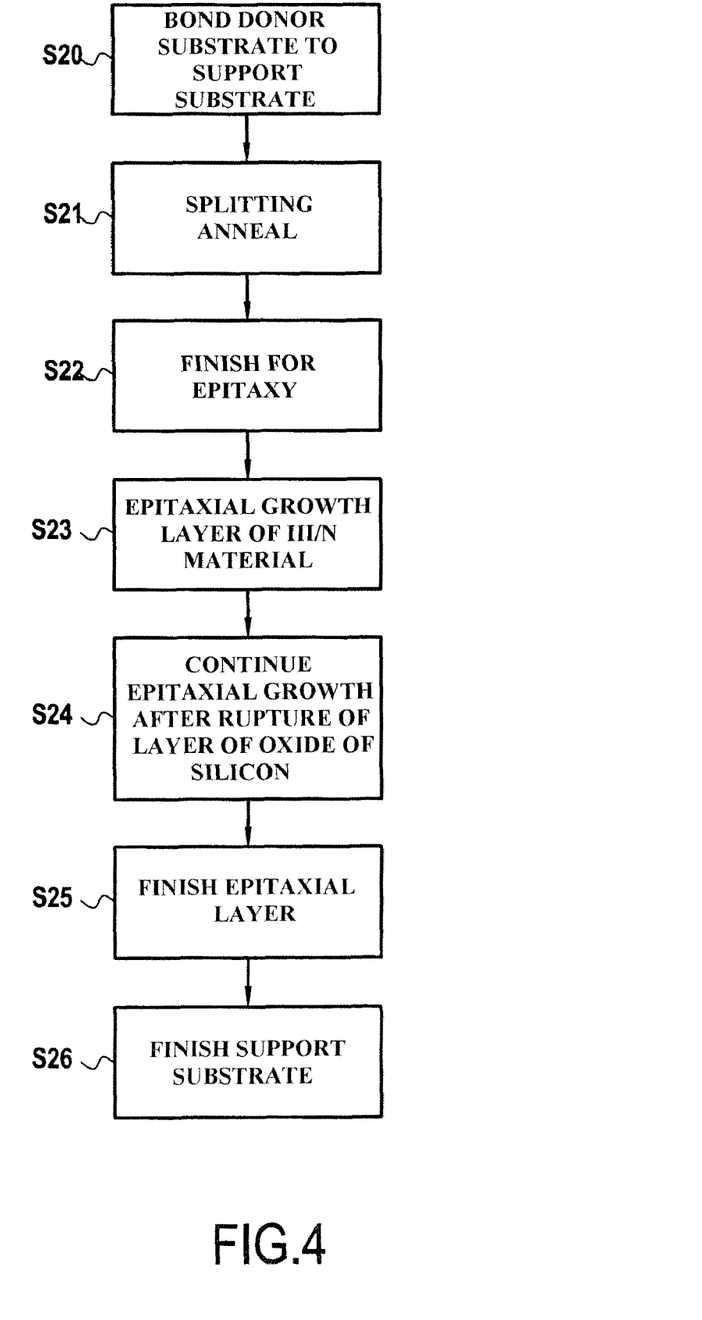
FIG. 4 is a flowchart of the steps carried out in FIGS. 3A to 3G.

The remainder 30a of the bonding layer of oxide and the thin film 24 are removed from the surface of the layer of GaN 35 by chemical etching and/or polishing (step S25, FIG. 3F).

The remainder 30b of the bonding layer of oxide is also removed from the support substrate 20 that could then be recycled, for example to form a new composite structure for epitaxy as described above (step S26, FIG. 3G).

What is claimed is:

1. A method of fabricating material by epitaxy, which comprises epitaxially growing at least one layer of a material on a composite structure comprising at least one thin film bonded to a support substrate, a bonding layer of oxide formed by deposition between the support substrate and the thin film, with the thin film and the support substrate having a mean thermal expansion coefficient of $7 \times 10^{-6}$ K$^{-1}$ or more in a temperature range of 20° C. to 1200° C., wherein the bonding layer of oxide is formed by low pressure chemical vapor deposition (LPCVD) of a layer of silicon oxide on either a bonding face of the support substrate or a bonding face of the thin film, or both, wherein the thin film has a thickness that is less than or equal to the thickness of the bonding layer of oxide, wherein the method includes a heat treatment carried out during or after the epitaxial growing of the layer of material and at a temperature that is higher than that used for depositing the layer of oxide, with the heat treatment being applied with a thermal budget that can at least initiate the forming of microcavities in the bonding layer in order to weaken the bond between the support substrate and the thin film.

2. The method of claim 1, wherein the heat treatment is initiated at the same time as the epitaxial growing, but that the epitaxial growing is carried out at a temperature that is higher than the temperature at which the layer of oxide of silicon is deposited, thus contributing at least in part to the heat treatment.

3. The method of claim 1, wherein the heat treatment is carried out after the epitaxial growing, with the epitaxial growing carried out at a temperature that is lower than the temperature for depositing the layer of oxide of silicon.

4. The method of claim 1, wherein the free surface of the layer of material formed during the epitaxial growth step is bonded to a target support.

5. The method of claim 1, wherein the heat treatment step is carried out for a period that can provoke detachment of the support substrate.

6. The method of claim 1, which further comprises, after the heat treatment, applying a mechanical separation stress at the bonding layer of oxide to provoke detachment of the support substrate.

7. The method of claim 1, which further comprises, after the heat treatment, chemically attacking the bonding layer of oxide to provoke detachment of the support substrate.

8. The method of claim 1, wherein the layer of silicon oxide is formed using precursors of silane, dichlorosilane or tetraethyl orthosilicate.

9. The method of claim 1, which further comprises, prior to bonding, conducting a densification heat treatment of the layer of silicon oxide.

10. The method of claim 1, wherein the thin film is transferred to the support substrate by:

implanting ions by bombardment of a face of the donor substrate to form, at a predetermined depth in the donor substrate, a layer of weakness defining the thin film between the donor substrate face and the layer of weakness;

placing the donor substrate face in intimate contact with the support substrate to bond the two together; and detaching the thin film splitting at the layer of weakness of the donor substrate.

11. The method of claim 1, wherein the thin film is transferred to the support substrate by:

bringing one face of a donor substrate into intimate contact with the support substrate to bond the two together; and thinning the donor substrate to leave only the thin film on the support substrate.

12. The method of claim 1, wherein the layer of silicon oxide has a thickness of approximately 0.2 to 0.75 micrometers.

13. The method of claim 1, wherein the support substrate comprises sapphire, LiTaO3, LiNbO3, MgO, or an alloy of Ni, Cr, Mo and W.

14. The method of claim 1, wherein the thin film comprises sapphire, LiTaO3, MgO or LiNbO3.

15. The method of claim 1, wherein the layer of epitaxially grown semiconductor material is a layer of a binary, ternary, or quaternary III/N material.

* * * * *